United States Patent
Ho et al.

(10) Patent No.: US 8,569,169 B2
(45) Date of Patent: Oct. 29, 2013

(54) BOTTOM SOURCE POWER MOSFET WITH SUBSTRATELESS AND MANUFACTURING METHOD THEREOF

(75) Inventors: Yueh-Se Ho, Sunnyvale, CA (US); Yan Xun Xue, Los Gatos, CA (US); Ping Huang, Songjiang (CN)

(73) Assignee: Alpha & Omega Semiconductor, Inc., Sunnyvale, CA (US)

(*) Notice: Subject to any disclaimer, the term of this patent is extended or adjusted under 35 U.S.C. 154(b) by 14 days.

(21) Appl. No.: 13/273,219

(22) Filed: Oct. 13, 2011

(65) Prior Publication Data
US 2012/0032259 A1  Feb. 9, 2012

Related U.S. Application Data

(63) Continuation-in-part of application No. 12/790,773, filed on May 28, 2010, and a continuation-in-part of application No. 12/916,086, filed on Oct. 29, 2010.

(51) Int. Cl.
*H01L 21/44* (2006.01)

(52) U.S. Cl.
USPC ........... 438/667; 438/613; 438/197; 257/330; 257/737; 257/288; 257/621

(58) Field of Classification Search
USPC ....... 438/612, 613, 614, FOR. 424, 586, 197, 438/597, 667, 666; 257/E23.153, 737, 738, 257/692, 676, 401, 341, 578, 502, 690, 691, 257/774, E29.262, E21.19, E21.159, 257/E27.099, 330, 350, 901, 288, 332, 334, 257/621, 673

See application file for complete search history.

(56) References Cited

U.S. PATENT DOCUMENTS

| | | | |
|---|---|---|---|
| 2007/0040255 A1* | 2/2007 | Osone et al. | 257/678 |
| 2008/0012119 A1* | 1/2008 | Otremba et al. | 257/698 |
| 2009/0224313 A1* | 9/2009 | Burke | 257/330 |

* cited by examiner

*Primary Examiner* — Thanh Y Tran
(74) *Attorney, Agent, or Firm* — Chein-Hwa Tsao; CH Emily LLC (57) ABSTRACT

A bottom source power metal-oxide-semiconductor field-effect transistor (MOSFET) device includes a gate electrode and a source electrode formed on an initial insulation layer on a first surface of a semiconductor chip and a drain electrode formed on a second surface of the semiconductor chip. The source electrode includes a source metal, a source electrode bump formed on the source metal and a source electrode metal layer on top of the source electrode bump. A first insulation layer covers the gate electrode. A through via aligned to the gate electrode is formed from the second surface of the chip to expose a portion of the gate electrode from the second surface.

8 Claims, 6 Drawing Sheets

BOTTOM SOURCE POWER MOSFET WITH SUBSTRATELESS AND MANUFACTURING METHOD THEREOF

PRIORITY CLAIM

This application is a continuation-in-part (CIP) and claims the priority benefit U.S. patent application Ser. No. 12/790,773 filed May 28, 2010 and U.S. patent application Ser. No. 12/916,086 filed Oct. 29, 2010.

FIELD OF THE INVENTION

The invention relates to a semiconductor device and manufacturing method thereof, in particular to a substrateless bottom source power MOSFET device and a manufacturing method thereof.

BACKGROUND OF THE INVENTION

A vertical power MOSFET device usually has a source electrode formed of a source metal layer and a gate electrode formed of a gate metal layer disposed on a top surface of the semiconductor chip and a drain electrode formed of a drain metal layer on a bottom surface of the semiconductor chip. A bottom source power MOSFET chip having a source electrode on one surface and the gate electrode and the drain electrode on the other surface is preferred in applications such as stacked die co-package structure used in a DC-DC converter. In other applications, bottom source power MOSFET chip is required, for example, when the die paddle of a lead frame package is used as the ground electrode.

SUMMARY OF THE INVENTION

The present invention provides a bottom source power MOSFET device comprising a drain electrode, a gate electrode and a source electrode electrically insulated from each other for electrically connecting to the external device. The source electrode is formed at a first surface of a semiconductor chip that is flipped with the first surface facing downward, thus the source electrode is exposed at the bottom of the power MOSFET device. As such, the drain electrode formed at a second surface of the chip is exposed at the top of the power MOSFET device. A gate electrode formed at the first surface of the chip is partially exposed from a through via formed on the second surface of the chip, thereby providing access to the gate electrode from the top of the power MOSFET device.

The semiconductor chip comprises a substrate and an initial insulation layer formed on a first surface of the substrate. When the first surface of the chip is upward, a source metal is formed on the initial insulation layer of the chip, a source electrode bump is formed on the source metal and a source electrode metal layer is formed on the source electrode bump. The source metal and a gate metal are respectively formed on the initial insulation layer and are electrically insulated from each other. A first insulation layer is deposited on the gate metal and the source metal with a portion of the top surface of the source metal exposed from the first insulation layer. The source electrode bump is made of a metal on the exposed portion of source metal by electroplating.

A molding compound is deposited covering the first insulation layer and the external surface of the source electrode bump. The molding compound is then ground to expose the top surface of the source electrode bump. A source electrode metal layer is formed on the top surface of the source electrode bump and the molding compound ready for electrically connecting to the external devices.

The chip is ground at its second surface to reduce its thickness to a substrateless level. A drain metal layer is formed to cover the second surface of the chip substrate via metallization forming a drain electrode for electrically connecting to the external devices. A through via aligned to the gate metal penetrates through the drain metal layer, the substrate and the initial insulation layer reaching the gate metal. The through via can be formed via a laser drilling method. Alternatively, the through via can be formed by wet or dry etching method. In this etching method, a first mask is firstly applied on the top surface of the drain electrode metal layer, which includes an opening corresponding to the position of the gate electrode. A wet or a dry etching is carried out through the opening in the first mask, etching down through the drain electrode metal layer, substrate and initial insulation layer to form the though via with portion of the second surface of the gate electrode exposed from the through via.

A second insulation layer is formed at the second surface of the chip to cover the top surface of the drain electrode metal layer and the side wall and bottom of the through via. A second mask is applied on the second insulation layer, covering the sides of the through via and portions of the second insulation layer surrounding the through via. The second insulation layer not covered by the second mask is removed by etching. As such, the side wall of the though via and portions of the drain electrode metal layer surrounding the through via in a certain distance are covered by the second insulation layer, while the bottom of the through via is not covered by the second insulation layer with a portion of the gate metal exposed from the bottom of the through via forming a gate electrode.

The present invention provides a bottom source power MOSFET device and a manufacturing method thereof, with the source electrode exposed at the bottom of the device, and the drain electrode and the gate electrode exposed at the top of the device and electrical isolated from each other. The method of the present invention is simple and effectively reduces the number of mask used (only two masks) during the process and can be applied for a thin chip, i.e., with a thickness of substrateless level. An insulation protection is carried out between the drain electrode and the gate electrode area via the second insulation layer in the through via and the initial insulation layer of the backside of the gate electrode, therefore short circuit between the drain electrode and the gate electrode can be effectively prevented.

DETAILED DESCRIPTION OF THE EMBODIMENTS

Figure 1:
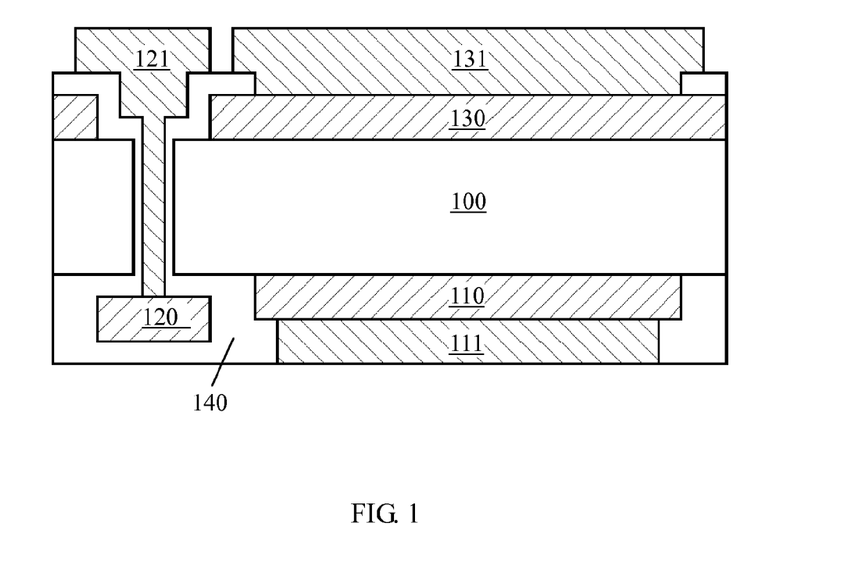
FIG. 1 is a cross-sectional schematic diagram of a bottom source power MOSFET device according to present invention.

FIG. 1 is a cross-sectional diagram illustrating a power MOSFET device according to this invention. The power MOSFET chip 100 includes a gate metal layer 120 and a source metal layer 110 formed correspondingly at a first surfaces of the chip 100, and a drain metal layer 130 formed correspondingly on the second surface of the chip. A solderable source electrode metal layer 111 is deposited on the source metal layer 110 and a solderable drain electrode metal layer 131 is deposited on the drain metal layer 130. As shown in FIG. 1, the power MOSFET chip 100 is flipped with its first surface at the bottom and its second surface at the top of the semiconductor device. A through via is formed through the chip 100, which is lined with a thin dielectric layer and then filled with a metal forming a gate electrode extension 121, one end of which is electrically connected to the gate electrode metal layer 120 and the other end extending and exposing at the second surface of the power MOSFET chip or the top surface of the semiconductor structure forming a gate electrode for electrically connecting to external devices. The gate electrode extension 121 is also electrically insulated from the substrate of chip 100, the drain electrode metal 130 and drain soldering layer 131 via a dielectric layer.

Furthermore, a passivation layer 140 is formed for electrically isolating the source metal layer 110 and the solderable source electrode metal layer 111 from the gate metal layer 120 by completely encapsulating the gate metal layer 120 inside the passivation layer 140. The solderable source electrode metal layer 111 and the solderable drain electrode metal layer 131 are respectively exposed forming the drain electrode and the source electrode for electrically connecting to the external devices. As shown in FIG. 1, the gate electrode and the drain electrode are located at the top of the power MOSFET device, while the source electrode is located at the bottom of the power MOSFET device.

Figure 2:
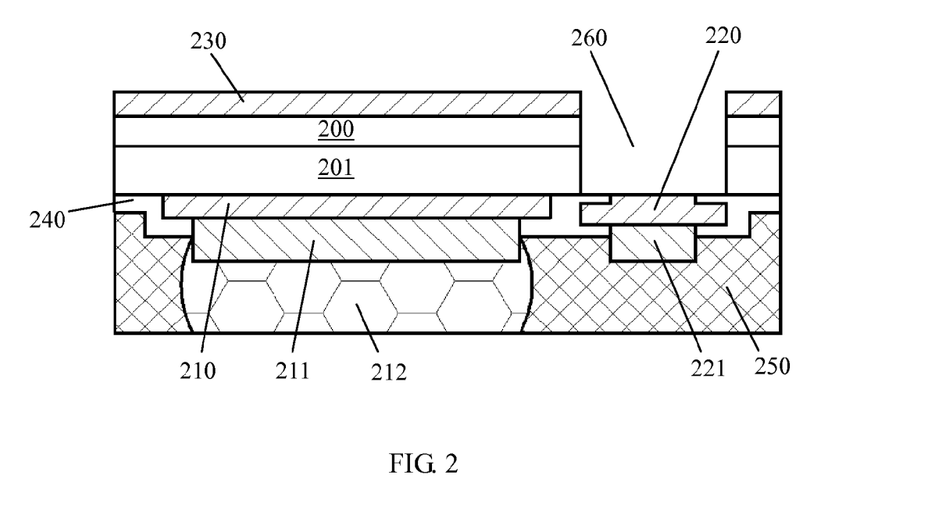
FIG. 2 is a cross-sectional schematic diagram of another bottom source power MOSFET device according to present invention.

FIG. 2 is a cross-sectional diagram illustrating another conventional power MOSFET device. As shown in FIG. 2, the power MOSFET device includes a source electrode at bottom of the device and an initial layer 201 of silicon oxide formed at the first surface of the chip substrate 200. A gate metal 220 and a source metal 210 are formed at the initial insulation layer 201, with a gate electrode metal layer 221 and a source electrode metal layer 211 correspondingly formed at the gate metal 220 and the source metal 210. The gate metal 220 and the gate electrode metal layer 221 are electrically insulated from the source metal 210 and the source electrode metal layer 211 via an electrical insulation layer 240. A solder ball 212 is placed on the source electrode metal layer 211. The gate electrode metal layer 221 and the solder ball 212 exposed out of the insulation layer 240 are encapsulated by a molding compound 250. The bottom surface of the solder ball 212 is exposed out of the bottom surface of the molding compound 250, thereby forming the source electrode area for electrically connecting to the external devices.

A drain metal layer 230 located at the second surface of the chip substrate 200 corresponding to the top of the power MOSFET device is used as the drain electrode for electrically connecting to the external devices. A through via 260 is formed correspondingly to the position of the gate electrode 220, which penetrates through the drain metal layer 230, the chip substrate 200 and the initial insulation layer 201 and stops at the surface of the gate electrode 220, thereby forming a gate electrode area for electrically connecting to the external device. In this structure, the drain electrode and the exposed gate electrode in the through via 260 are located at the top side of the power MOSFET device, while the source electrode area is located at the bottom side of the power MOSFET device. Preferably the side wall of the through via 260 should be lined with an insulation layer as that shown in FIG. 14, to prevent a circuit short between the gate electrode and the drain, which generally extends from the bulk of substrate to the side wall of the through via.

Figure 12:
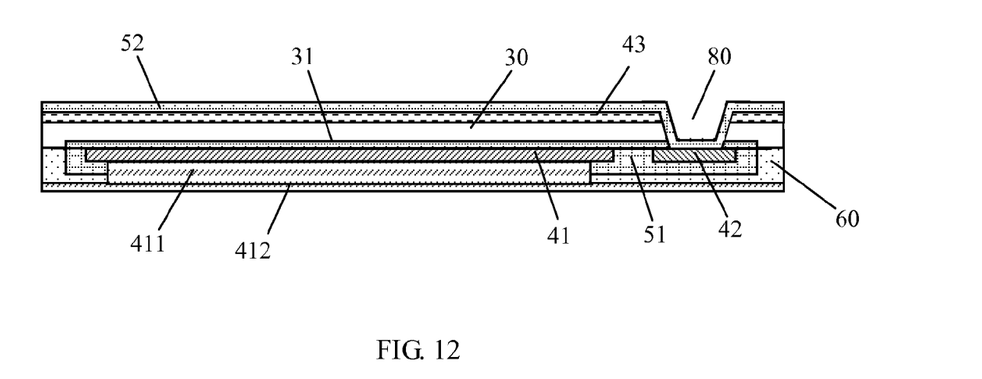
Figure 13:
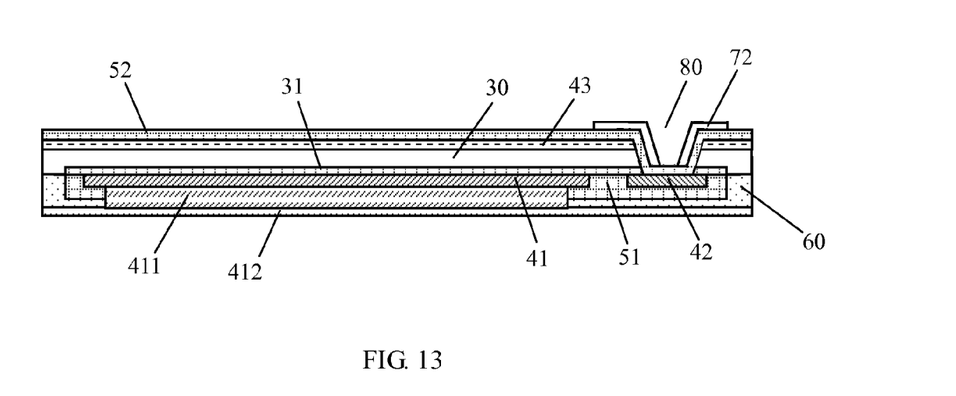
Figure 14:
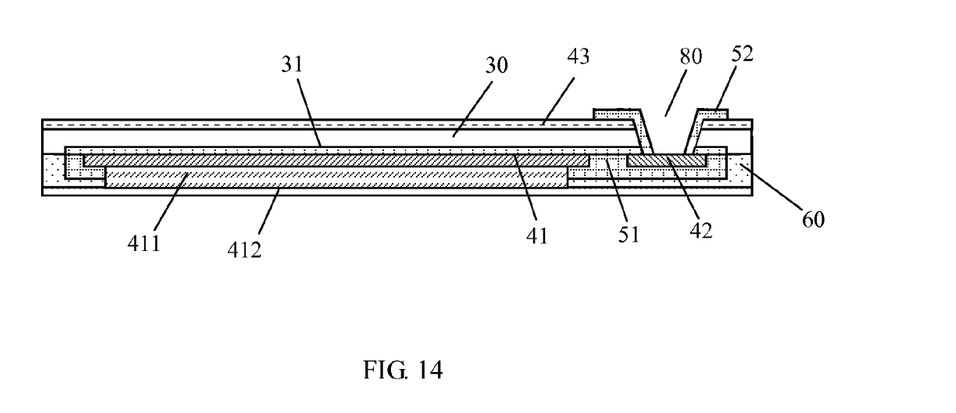

FIG. 14 is a cross-sectional schematic diagram of a preferred embodiment of a bottom source power MOSFET device of the present invention and FIGS. 3-14 are the process steps of making the device according to present invention. In this power MOSFET device, the drain electrode and the gate electrode are exposed at the top side of the device for electrically connecting to the external devices, while the source electrode is exposed at the bottom side of the device.

Figure 3:
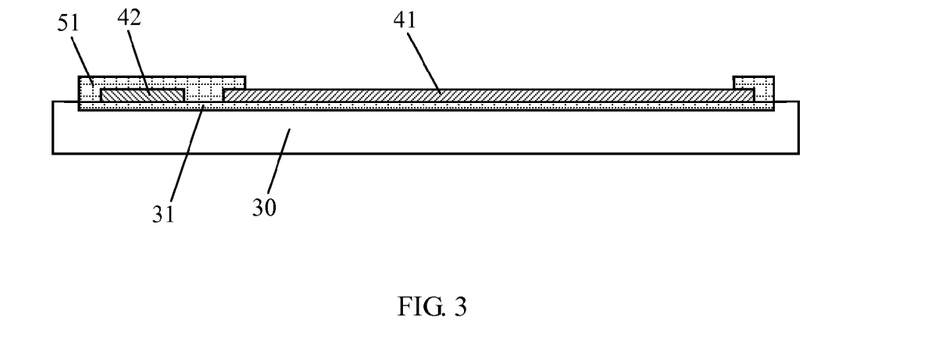
FIGS. 3 to 14 are cross-sectional schematic diagrams illustrating a process flow for manufacturing of power MOSFET device of the present invention.

Referring to FIG. 3, an initial insulation layer 31 is formed on a first surface of the substrate 30 of a semiconductor chip. In one embodiment an edge of the initial insulation layer 31, such as an oxide, extends to a distance away from the edge of substrate. A gate metal 42 and a source metal 41 are formed on the initial insulation layer 31 with an edge of the gate metal and an edge of the source metal recess from the edges of the initial insulation layer 31. A first insulation layer 51, such as an oxide or nitride, is deposited having an edge extending beyond the edge of the gate metal layer to encapsulate the gate metal 42, to fill the space between the gate metal 42 and the source metal 41, and to cover the sides and portions of the top surface at the edge of the source metal 41 to prevent short circuit.

Figure 4:
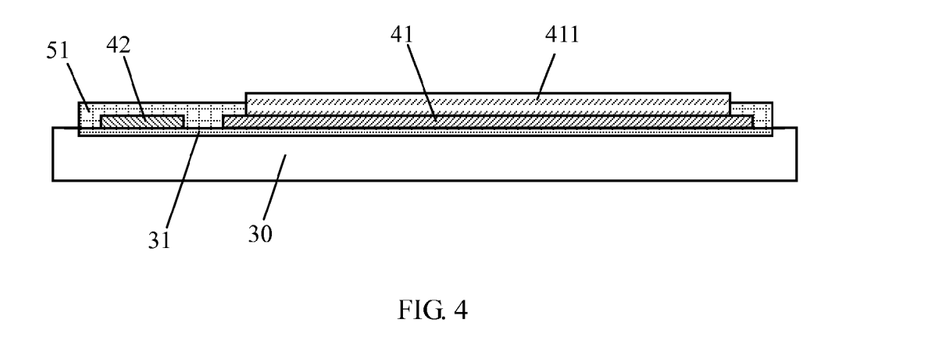

Referring to FIG. 4, a metal source electrode bump 411 is formed on the exposed surface of the source metal 41 that is not covered by the first insulation layer 51 via electroplating. The top surface of the source electrode bump 411 is higher than that of the first insulation layer 51. The source electrode bump 411 and the gate metal 42 are electrically insulated from each other via the first insulation layer 51.

Figure 5:
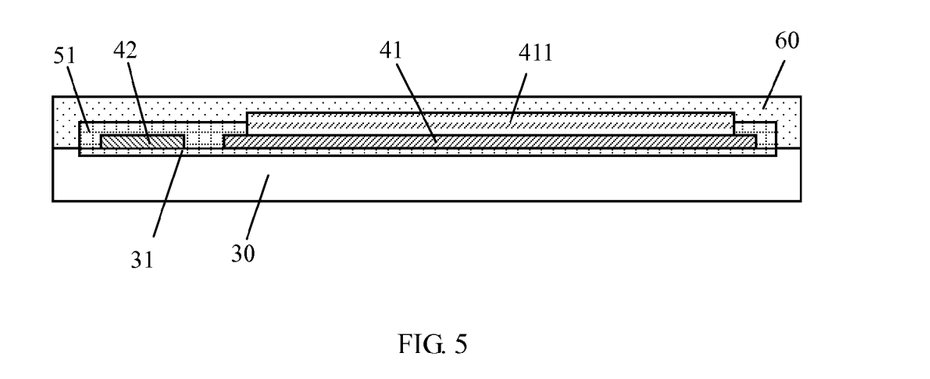
Figure 6:
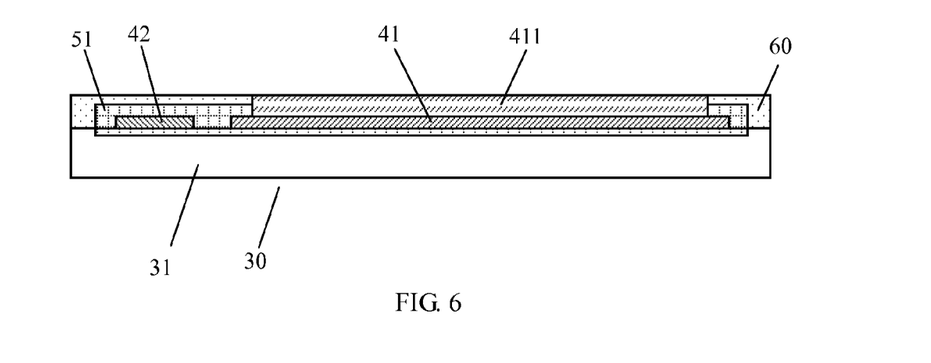
Figure 7:
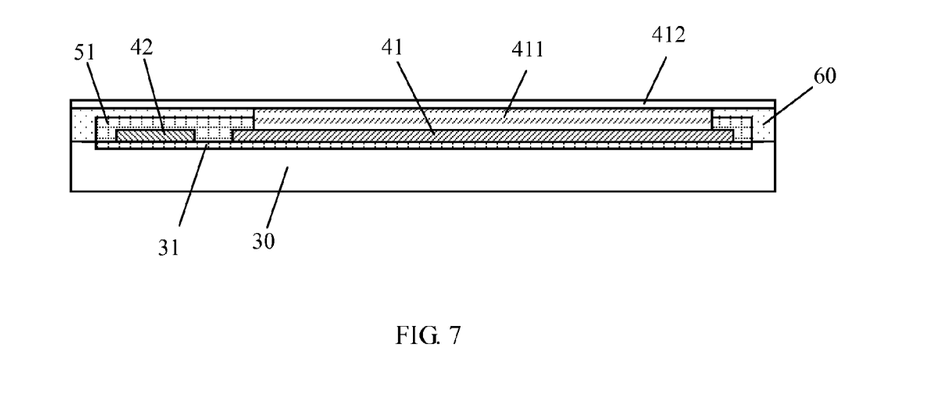

Referring to FIG. 5, a dielectric material 60, such as a molding compound or silicon oxide, of a predetermined thickness is deposited on top of the structure to encapsulate the first insulation layer 51 and the source electrode bump 411. The dielectric material may extend to the edge of the substrate. As shown in FIG. 6, the dielectric material 60 may be ground or polished from its top surface to expose the top surface of the source electrode bump 411. As shown in FIG. 7, a source electrode metal layer 412 is deposited on the top surface of the source electrode bump 411 and the molding compound 60, which is connected with the source electrode 41 via the source electrode bump 411, thereby forming a source electrode of the semiconductor chip for electrically connecting to the external devices. The source electrode metal layer extends to the edge of the semiconductor substrate.

Figure 8:
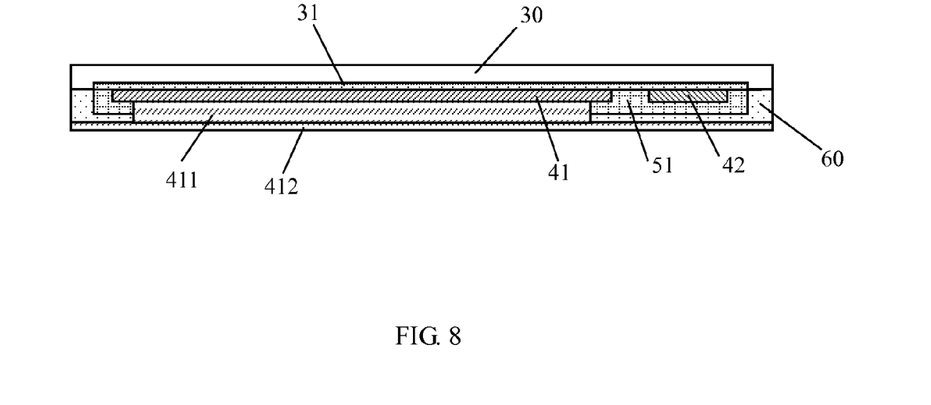
Figure 9:
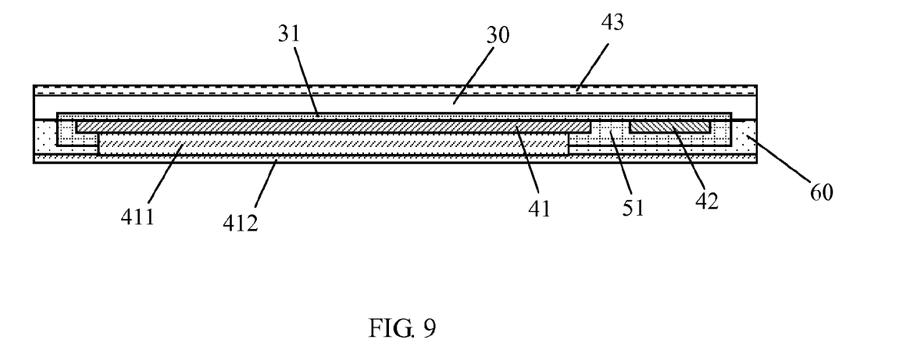

Referring to FIG. 8, the chip is flipped, thus the source electrode is located at the bottom side of the power MOSFET device. The second surface of the substrate 30 of the chip is ground to reduce its thickness to substrateless level, for example, 10 microns or thinner. In some applications, the chip is thinned to 4 microns or 2 microns. A drain metal layer 43 is formed to cover the whole second surface of the substrateless chip 30 to form a drain electrode for connecting to the external devices as shown in FIG. 9.

Figure 10:
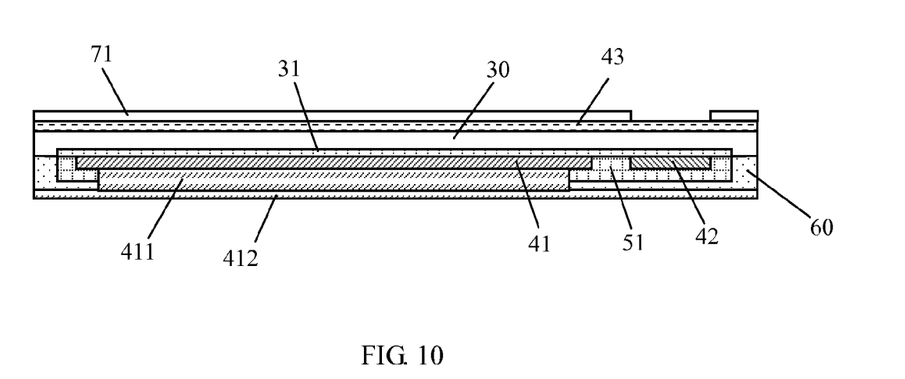
Figure 11:
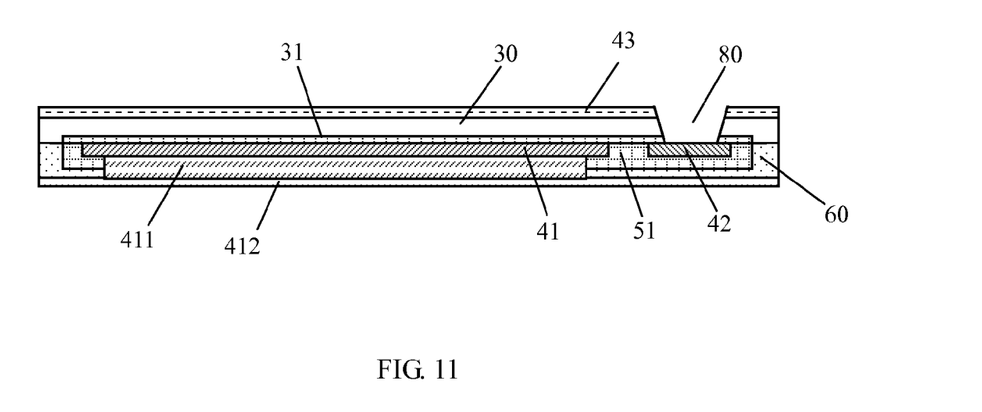

As shown in FIG. 10, a first mask 71, which includes an opening aligned to the gate electrode 42, is applied on the top surface of the drain electrode metal layer 43. Wet and/or dry etching is performed through the opening on the first mask from the backside of the thinned chip and into the drain electrode metal layer 43, the substrate 30 and the initial insulation layer 31 and ends at the gate electrode 42 to form a through via 80 as shown in FIG. 11. The first mask is then removed. Alternatively, the through via 80 may be formed by laser drilling without the use of mask 71.

A second insulation layer 52 is deposited to cover the drain metal layer 43 and the bottom and side wall of the through via 80 as shown in FIG. 12. The second insulation layer 52 extends to the bottom and along the side wall of the through via 80, thus connecting to the initial insulation layer 31.

As shown in FIG. 13 and FIG. 14, a second mask 72 is applied on the second insulation layer 52, which includes an opening at the gate electrode 42 at the bottom of the through via 80. The second insulation layer 52 covered by the second mask 72 is retained via etching or similar process, while the exposed area of the second insulation layer 52 is removed. Specifically, the second insulation layer 52 on the side wall of the through via 80 and in the area above the drain electrode metal layer 43 surrounding the through via 80 in a certain distance is retained, while the rest of the second insulation layer 52 at the top surface of the drain electrode metal layer 43 and the bottom of the through via 80 are removed. The exposed part of the drain metal layer 43 and the exposed part of the gate metal 42 form the drain electrode and the gate electrode respectively of the power MOSFET device for connecting to the external devices.

As shown in FIG. 14, in the power MOSFET device of this invention, the drain electrode and the gate electrode are located at the top side of the device, while the source electrode area is located at the bottom side of the device. Furthermore, the drain electrode and the gate electrode are electrically insulated and protected by the second insulation layer 52 in the through via 80 and the initial insulation layer 31, therefore short circuit between the drain electrode and the gate electrode can be effectively prevented.

The chip thickness of the present invention power MOSFET device is at substrateless level and the overall manufacturing process for making thinned power MOSFET device only uses two masks. In case laser drilling method is used to form the through via 80, only one mask (second mask 72) is used in the manufacturing process.

Although the content of the present invention has been introduced in detail through above preferred embodiments, it should be recognized that above descriptions should not be regarded as the limitation to the invention. Various changes and variations are undoubtedly obvious for the technical personnel of the field after reading the specification. Therefore, the protection scope of the invention shall be limited by the attached claims.

The invention claimed is:

1. A manufacturing method of a bottom source power MOSFET device comprising:
    forming a gate metal and a source metal at a first surface of a semiconductor chip, the gate metal and the source metal being electrically insulated from each other, wherein forming the gate metal and source metal at the first surface of the semiconductor chip further comprising:
        forming an initial insulation layer on a substrate of the semiconductor chip; and
        depositing a metal layer on top of the initial insulation layer and patterning the metal layer into the gate metal and the source metal;
    forming a source electrode bump on the source metal by depositing a first insulation layer encapsulating the gate metal and an edge portion of the source metal, and electrode plating a metal onto the source metal exposed through the first insulation layer;
    depositing a dielectric material overlaying the gate metal and part of the source metal not covered by the source electrode bump, a surface of the dielectric material being coplanar to a surface of the source electrode bump;
    forming a source electrode metal layer overlaying the surface of the source electrode bump and the surface of the dielectric layer, wherein the source electrode metal layer being ready for connecting to the external devices;
    grinding the semiconductor chip from its second surface to reduce its thickness;
    depositing a drain metal layer on the second surface of the semiconductor chip;
    forming a through via above the gate metal from the second surface of the semiconductor chip to expose a portion of the gate metal; and
    forming an insulation layer covering a side wall of the through via;
    wherein the step of depositing the dielectric material overlaying the gate metal and part of the source metal not covered by the source electrode bump further comprising depositing a molding compound to cover the first insulation layer and the source electrode bump, and removing a portion of the molding compound to expose the surface of the source electrode bump.

2. A manufacturing method of a bottom source power MOSFET device comprising:
    forming a gate metal and a source metal at a first surface of a semiconductor chip, the gate metal and the source metal being electrically insulated from each other;
    forming a source electrode bump on the source metal;
    depositing a dielectric material overlaying the gate metal and part of the source metal not covered by the source electrode bump, a surface of the dielectric material being coplanar to a surface of the source electrode bump;
    forming a source electrode metal layer overlaying the surface of the source electrode bump and the surface of the dielectric layer, wherein the source electrode metal layer being ready for connecting to the external devices;
    grinding the semiconductor chip from its second surface to reduce its thickness;
    depositing a drain metal layer on the second surface of the semiconductor chip;
    forming a through via above the gate metal from the second surface of the semiconductor chip to expose a portion of the gate metal; and
    forming an insulation layer covering a side wall of the through via;
    wherein selected portions of the drain metal layer, the substrate of the semiconductor chip and the initial insulation layer being removed via laser drilling to form the through via.

3. The manufacturing method of bottom source power MOSFET device of claim 2 wherein the step of forming the gate metal and source metal at the first surface of the semiconductor chip further comprising:
    forming an initial insulation layer on a substrate of the semiconductor chip; and
    depositing a metal layer on top of the initial insulation layer and patterning the metal layer into the gate metal and the source metal.

4. The manufacturing method of bottom source power MOSFET device of claim 3 wherein the step of forming the source electrode bump on the source metal further comprising depositing a first insulation layer encapsulating the gate metal and an edge portion of the source metal, and electrode plating a metal onto the source metal exposed through the first insulation layer.

5. A manufacturing method of a bottom source power MOSFET device comprising:
    forming a gate metal and a source metal at a first surface of a semiconductor chip, the gate metal and the source metal being electrically insulated from each other;
    forming a source electrode bump on the source metal;

depositing a dielectric material overlaying the gate metal and part of the source metal not covered by the source electrode bump, a surface of the dielectric material being coplanar to a surface of the source electrode bump;

forming a source electrode metal layer overlaying the surface of the source electrode bump and the surface of the dielectric layer, wherein the source electrode metal layer being ready for connecting to the external devices;

grinding the semiconductor chip from its second surface to reduce its thickness;

depositing a drain metal layer on the second surface of the semiconductor chip;

forming a through via above the gate metal from the second surface of the semiconductor chip to expose a portion of the gate metal; and forming an insulation layer covering a side wall of the through via;

wherein the step of forming a through via above the gate metal from the second surface of the semiconductor chip to expose a portion of the gate metal comprising:

applying a first mask on the top surface of the drain metal layer, the first mask including an opening corresponding to the position of the gate electrode; and removing portions of the drain metal layer, the substrate of the semiconductor chip and the initial insulation layer through the opening by wet or dry etching to form the through via.

6. The manufacturing method of bottom source power MOSFET device of claim 5, wherein forming an insulation layer covering the side wall of the through via further comprising depositing a second insulation layer covering the side wall and bottom of the through via and the drain metal layer, applying a second mask on top of the second insulation layer, the second mask covering the second insulation layer on the side wall of the through via and portions of the second insulation layer surrounding the through via; and removing portions of the second insulation layer not covered by the second mask by etching to expose a portion of the drain metal layer on the second surface of the semiconductor chip forming a drain electrode and a portion of the gate metal at the bottom of through via forming a gate electrode.

7. The manufacturing method of bottom source power MOSFET device of claim 5 wherein the step of forming the gate metal and source metal at the first surface of the semiconductor chip further comprising:

forming an initial insulation layer on a substrate of the semiconductor chip; and depositing a metal layer on top of the initial insulation layer and patterning the metal layer into the gate metal and the source metal.

8. The manufacturing method of bottom source power MOSFET device of claim 7 wherein the step of forming the source electrode bump on the source metal further comprising depositing a first insulation layer encapsulating the gate metal and an edge portion of the source metal, and electrode plating a metal onto the source metal exposed through the first insulation layer.

* * * * *